United States Patent [19]

Shamash et al.

[11] 3,823,467

[45] July 16, 1974

[54] SOLID-STATE CIRCUIT MODULE

[75] Inventors: Maurice B. Shamash, Randallstown; Stephen G. Konsowski, Glen Burnie; Frank A. Lindberg, Baltimore; Seymour J. Ponemone, Randallstown, all of Md.

[73] Assignee: Westinghouse Electric Corporation, Pittsburgh, Pa.

[22] Filed: July 7, 1972

[21] Appl. No.: 269,689

[52] U.S. Cl. .......................... 29/580, 29/590, 29/578

[51] Int. Cl. .............................................. B01j 17/00

[58] Field of Search .......... 29/576 S, 578, 580, 626, 29/590, 591; 156/22; 252/79.2

[56] References Cited

UNITED STATES PATENTS

| | | | |
|---|---|---|---|
| 3,271,625 | 9/1966 | Caracciolo | 29/576 S |
| 3,317,287 | 5/1967 | Caracciolo | 29/576 S |
| 3,390,308 | 6/1968 | Marley | 29/576 S |
| 3,689,991 | 9/1972 | Aird | 29/576 S |
| 3,715,250 | 2/1973 | Altman | 156/22 |
| 3,745,648 | 7/1973 | Wiesner | 29/580 |
| 3,748,726 | 7/1973 | Wiesner | 29/580 |

*Primary Examiner*—W. Tupman
*Attorney, Agent, or Firm*—D. Schron

[57] ABSTRACT

There is disclosed a solid-state circuit module with the integrated circuits, regardless of what type, mounted back-down on a substrate to improve cooling of the active surfaces. A method of making such a module is also disclosed. The integrated circuits are positioned in openings or windows in a sheet of polyimide having, formed on its surface by printed circuit techniques, appropriate patterns of conductor sections or strips or lines with certain strips extending cantilever-like from one surface of the sheet over the openings. The terminals of the integrated circuits are connected, typically by ultrasonic bonding, to the ends of the centilever-like strips. The sheet unit thus formed is mounted on, and its strips are appropriately connected to, a sukstrate, typically of alumina. The sheet is formed with pads which are diffusion bonded to the substrate, typically by bonding to metal, typically gold. The backs of the integrated circuits are likewise bonded to the substrate.

9 Claims, 8 Drawing Figures

SOLID-STATE CIRCUIT MODULE

REFERENCE TO RELATED DOCUMENTS

Application Ser. No. 262,871 filed June 14, 1972, to Lindberg et al, for FORMATION OF OPENINGS IN DIELECTRIC SHEET and assigned to Westinghouse Electric Corporation is incorporated herein by reference. This application will be herein called Lindberg Application II.

BACKGROUND OF THE INVENTION

This invention relates to solid-state circuits and has particular relationship to solid-state circuit modules including integrated circuits. Among the different types of integrated circuits are those described as "standard", those referred to as beam-lead and those referred to as flip-chip. The different types of such circuits, their advantages and disadvantages, and the problems involved in their use are described in papers by Lawrence Curran in Electronics for Nov. 25, 1968 and Dec. 26, 1968 entitled *In Search Of A Lasting Bond* and in *U.S. Reports* in *Electronics* for Mar. 3, 1969, entitled *Big Push For Beam-Lead IC's Sparks Demand For Special Bonders.*

In accordance with the teachings of the prior art, the integrated circuits are mounted on a substrate which is provided with a printed circuit and interconnected with this circuit. A typical practice is to interconnect the terminals of the integrated circuit and the substrate terminals by so-called flying-wire bonds. A fine wire, typically of gold, carried by a capillary tube, is balled at the end and the ball is connected to the integrated circuit. Then the wire is moved from the ball to a substrate terminal. Flying-wire bonds are unreliable and in an effort to avoid them beam-lead and bumped flip-chip integrated circuits were produced. These are connected active face down to the substrate. The beam-lead and bumped flip-chip integrated circuits suffer from the disadvantage that the active surfaces of the integrated circuits are not effectively cooled.

It is an object of this invention to overcome the above disadvantages of the prior art and to provide a solid-state circuit module including integrated circuits in which the flying-wire bonds shall be eliminated and the integrated circuits, whether they be standard, beam-lead or bumped flip-chips or other types, shall be mounted back-down and shall be effectively cooled.

SUMMARY OF THE INVENTION

In accordance with this invention the integrated circuits are first connected to a sheet or film having an appropriate printed circuit pattern on its surface. Then the sheet and the circuits are mounted on, and connected to, a substrate. The sheet has windows for accommodating the integrated circuits with appropriate parts of the strips extending cantilever-like over the windows. The cantilever extensions are connected to the terminals of the chips.

Lindberg Application II is directed to a method for producing a dielectric sheet, typically a thick polyimide film, having windows or openings over which an electrical conductor of substantial thickness (.0008 to .001 inch) extends. The conductor is an integral part of a conductive coating extending over one surface of the sheet. A thick conductive coating also extends over the opposite surface of the sheet. The Lindberg Application II discloses the conversion, by printed-circuit techniques, of the conductive coatings into conductor patterns, the conductor strips or lines of the patterns having portions or beams which extend cantilever-like over the openings (see FIG. 20 Lindberg II). The surface over which the cantilever beams extend will be herein called the upper or outer surface of the sheet and the opposite surface will be called the lower or inner surface of the sheet.

In accordance with this invention, the integrated circuits are positioned in the openings, with their active faces flush or just below the upper surface of the sheet and their terminals in contact with the ends of the appropriate beams. Thereafter, the sheet with its integrated circuits are mounted in intimate thermal and mechanical contact with a substrate, typically an insulator such as alumina, having an appropriate printed circuit thereon. The sheet is mounted with its lower surface facing the substrate and the integrated circuits back down. The substrate is thermally highly conducting and serves as a thermal heat sink. The conductor strips of the pattern on the upper surface of the sheet are joined to conductor strips on the opposite face of the sheet through holes whose walls have an electrically conducting coating. The conductor strips on this opposite or lower surface in part serve as connections between strips on the upper surface and in part are connected to conductor strips on the substrate. The substrate typically includes the terminals connected to outside facilities; that is, the input and output terminals and the power-supply terminals for the solid-state circuit module.

The sheet has tabs on its lower surface. These tabs are diffusion bonded to corresponding tabs on the substrate. The integrated circuits are also bonded to tabs on the substrate.

Advantages achieved in the practice of this invention are as follows:

1. Unreliable flying-wire bonds are eliminated by interface-free deposited interconnections which are part of the homogeneous monometallic structure.
2. Effective heat transfer from the integrated circuits is achieved.
3. There can be a considerable saving in cost; particularly in comparison with the flying-wire bonds.
4. In process repair of modules is readily feasible.
5. The film, particularly when it is polyimide, is compliant and this compliance permits precise attachment of the cantilever conductor strips or beams to their respective pads of the integrated circuits or of the substrate with minimum residual strain.
6. The thermal expansions of the film, particularly when it is polyimide (KAPTON), and the metallization on the film, particularly when it is aluminum, are compatible, thus improving reliability and militating against rupture of connections.
7. Integrated circuits, of any type, can be mounted in a back-down mounting, thus rendering readily feasible inspection of the face of, and performance of functional electrical tests as necessary on, the integrated circuits.
8. The relatively high ductility of the deposited beams allows substantial relaxation and reduction in tolerance variations and manipulation in three dimensions for alignment of, and address to, the module.
9. Currently as many as one hundred cantilever beams can be formed on one sheet of polyimide (KAP- TON) about 1½ inches square. It is contemplated that soon it will be feasible to form several hundred such cantilever beams on such a sheet rendering the technique of this invention directly applicable to LSI wafer interconnection.

10. Batch fabrication techniques incorporating this invention have resulted in greater uniformity from module to module and unit cost has been lowered through semiautomation and high productivity.

11. Since the cantilever beams are preformed, human factors are reduced and reliability improved. The invention disclosed herein has proven successful in the MHz region of frequencies; it can also be used at lower frequencies.

BRIEF DESCRIPTION OF THE DRAWINGS

For a better understanding of this invention, both as to its organization and as to its method of operation, together with additional objects and advantages thereof, reference is made to the following description, taken in connection with the accompanying drawings, in which:

FIG. 2 is the same as FIG. 19 of Lindberg Application II;

DETAILED DESCRIPTION OF THE INVENTION

Figure 1:
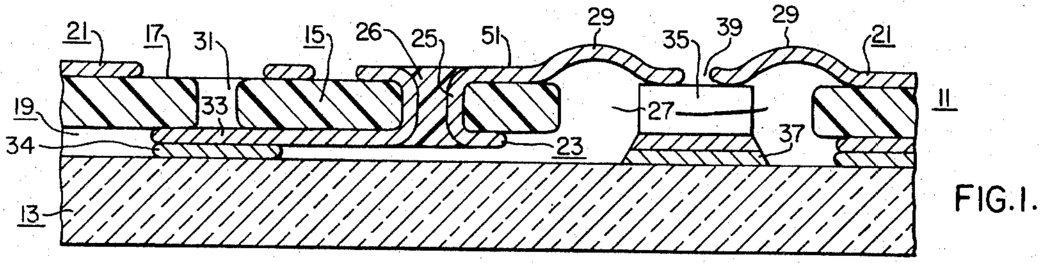
FIG. 1 is a fragmental view in section enlarged showing a solid-state circuit module in accordance with this invention and produced in the practice of this invention.

The apparatus shown in FIG. 1 is a module 11 including a substrate 13 of a highly thermally conducting electrical insulator, such as alumina, on which a sheet or film 15 of polyimide is mounted. The sheet 15 has a printed pattern on its upper or outer or front face 17 and on its lower or inner or back face 19 which includes strips 21 and 23 of electrically conducting material, typically aluminum. Certain of the strips 21 on the upper face 17 are connected to the strips 23 on the lower face through the conducting walls 25 of holes 26 of small diameter produced as disclosed in an application Ser. No. 260,636 filed June 7, 1972, to F. A. Lindberg et al. for PENETRATION OF POLYIMIDE FILMS and assigned to Westinghouse Electric Corporation. The sheet 15 also has windows 27 produced as disclosed in Lindberg II application, across which portions 29 of strips 21 extend cantilever-like or as cantilever beams.

The sheet 15 also has bonding openings 31 having the conductor coating 33 over their lower surfaces. This coating 33 is bonded to the substrate 13 through a bonding metal pad 34, typically of gold.

The apparatus shown in FIG. 1 includes integrated circuits 35. These circuits 35 are bonded backdown to the substrate 13 through bonding pads 37, typically of gold. The active surfaces 39 of the integrated circuits 35 are upward or outward and the terminals on this surface (not shown in FIG. 1) are electrically joined to the cantilever strips 29 near their ends.

Figure 2:
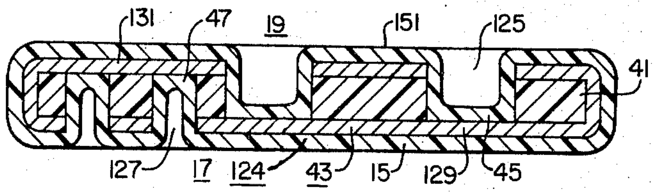
FIG. 2 is a view in section enlarged of a sheet, as disclosed in Lindberg Application II, of dielectric material, having windows and holes therein and coated with electrically conducting material of substantial thickness on both surfaces thereof, prepared for photographic processing.

The sheet 15 is produced by photographic processing of the sheet produced as disclosed in Lindberg Application II and there identified as 124 (FIG. 19). To facilitate understanding of this invention the numbering of Lindberg II Application is retained in FIG. 2 of this application. In FIG. 2 sheet 124 is shown with its upper outer side 17 down and its lower or inner side 19 up. The sheet 124 is formed of a base sheet 41 of dielectric material having openings 125 in its back or lower surface 19 and openings 127 in its front or upper surface 17. The sheet 41 is coated with an electrical conductor 43 typically aluminum. The conductor 43 includes portions 129 and 131 which extend respectively on the upper surface 17 over the openings 125 and on the lower surface 19 over the openings 127. The sheet 124 is coated with a photoresist coating 151 on both surfaces. Portions 45 and 47 of the coating 151 extend into the openings 125 and 127 masking the conductor portions 129 and 131 during the subsequent etching processes.

Figure 6:
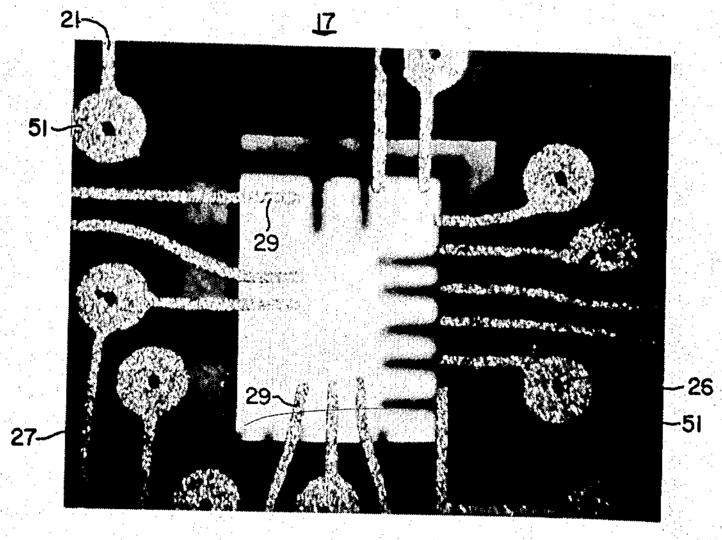
FIG. 6 is an enlarged photograph of a part of the surface of a sheet, produced by processing the structure shown in FIG. 2 in accordance with this invention, and showing a window and the conductor strips extending cantilever-like over the window.

The photoresist on both surfaces is exposed under appropriate masks and the exposed resist developed. Such exposure and developing is herein and in the claims sometimes referred to as imaging. Following the imaging the conductor patterns on both surfaces 17 and 19 of the sheet, including the conductor strips 21 and 23 (FIG. 2), the bonding portions 33, and the cantilever portions 29 remain protected by the processed photoresist remaining undissolved after developing. The remainder of the conductor coating 43 is exposed. The sheet is then acid etched removing the portion of conductor coating 43 which is exposed. Then the protecting developed photoresist is stripped away producing the sheet 15 and its upper and lower conductor patterns which is shown in FIG. 6 and in FIGS. 1, 3 and 4.

Figure 3:
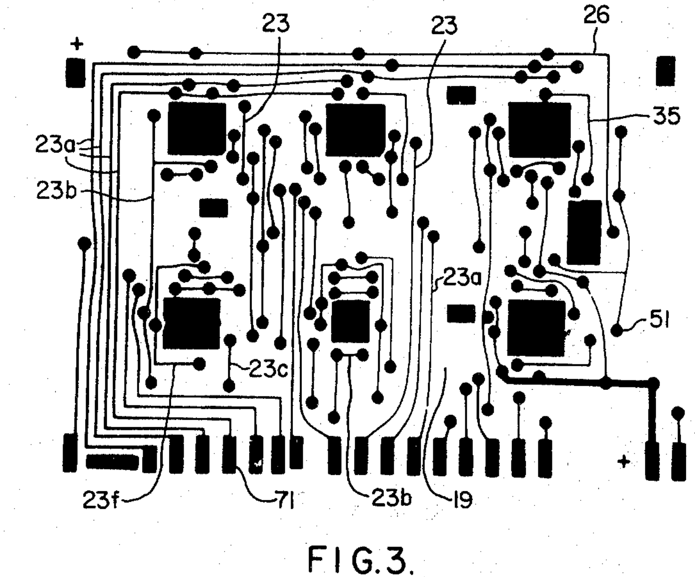
FIG. 3 is a photograph of the lower or under surface of a sheet of dielectric material, constituting part of the module shown in FIG. 1, and processed in the practice of this invention, to produce a printed pattern thereon.
Figure 4:
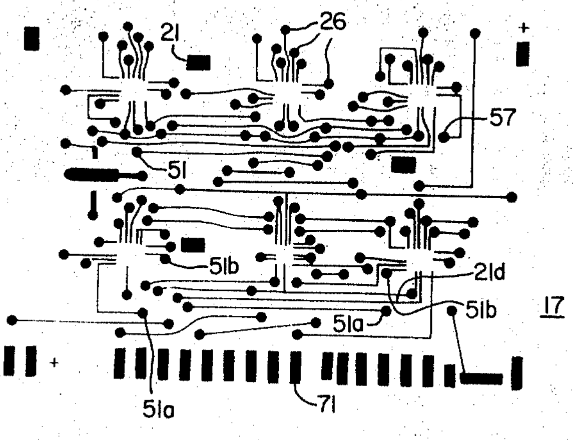
FIG. 4 is a photograph of the upper or outer surface of a module as shown in FIG. 1 processed in the practice of this invention to produce a printed pattern thereon which is complementary to, or coordinated with, the pattern of FIG. 3.

The artwork to produce the masks for the patterns shown in FIGS. 3 and 4 was actually carried out manually because the scale factor did not permit the ready use of automatic equipment, such as the Gerber plotter. However, where, in the practice of this invention, the necessary adjustment of computer software is warranted, the masks may be produced automatically.

It is essential that the outline definitions of the patterns including the lines 21 and 23, produced in the practice of this invention, be as sharp as practicable. In part definition is governed by the photoresist 151 deposited on sheet 124. For this reason a study was conducted to arrive at a most effective photoresist. The study was based on conductive coating of aluminum.

Kodak Metal Etch Resist was used briefly with the goal of increasing the quality of the line definition and producing better coverage of the edges of the aluminized through holes. The KMER resist accomplished these purposes but adhesion between photoresist and aluminum was poorer than with Kodak thin film resist. It was found that when using KTFR, aluminum deposited on the walls and backs of the holes must be coated by hand painting with photoresist after the pattern is imaged and developed to mask the coated parts during subsequent etching.

The masks were prepared on high resolution glass plates or MYLAR composition for dimensional stability and preservation of registration from front to back on the polyimide film. With the negative photoresist KTFR all the etch masks were made negatives of the artwork except for the through hole plates.

The initial conductor pattern was found to be slightly difficult to duplicate in the thick aluminum deposit since lines at several points in initial attempts passed within about two mils of through hole pads 51. For this reason the artwork was adjusted to reflect uniform conductor widths (0.004-inch) everywhere on both surfaces.

The etching also has an important bearing on the definition and thickness of the pattern. In arriving at an etchant in the practice of this invention a wide variety of acid solutions were tried and for each solution the resulting pattern was visually inspected for line definition and for the cross-section of the lines or strips of the pattern. The etch factor, that is, the ratio of the depth of the penetration of the etchant to its lateral penetration was also determined for each different solution. A low ratio would result in undercutting of the protected strips or lines.

Typically, the conductor 43 on the film is aluminum. For this conductor the etchant is a mixture of phosphoric acid, acetic acid, and nitric acid. A solution which served reasonably well was

| | |
|---|---|
| 375 ml (parts by volume) | $H_3PO_4$ |
| 75 ml | $CH_3COOH$ |
| 15 ml | $HNO_3$ |

at 60°C. To obtain optimum sharp line definition and adequate cross-section for the strips 21 and 23, each of the components of the solution was varied and the results studied to determine the effects of each.

An important factor in etching vapor deposited aluminum is that the etchability of the aluminum depends greatly on the rate at which the metal was deposited. Rates greater than 2,5000 A/minute produced aluminum that etched very slowly and unevenly even by strong aluminum etchants such as HCl. Often times the exposed aluminum seem to become passivated during the etching while undercutting of the resist coated aluminum continued. Once the proper rate of 2,000 A was determined, work continued to find the best etchant to etch 0.004-inch lines in 0.001-inch thick aluminum film.

The first variable investigated was the ratio of acetic acid to phosphoric acid. Increasing the acetic acid concentrations increases the etch factor (decrease undercutting) to a maximum of 1.5 at 3:2 $H_3PO_4$ to $CH_3COOH$. Thus a 0.004-inch line etched in 0.001-inch aluminum loses 0.0007 inch from each side of the line resulting in a 0.0026-inch line at the upper surface of the aluminum and 0.004 inch at the bottom surface of the aluminum. Further dilution with acetic acid caused a decrease of the etch factor. Phosphoric acid produced an etch factor of 1.2 with a much faster etching time, but line definition was poor.

The nitric acid was believed to decrease the chemical resistance of the photoresist resulting in decreased quality of line definition. Attempts to eliminate the nitric acid failed, for it is needed to prevent a black unetchable residue from forming during etching. Therefore, the amount of nitric acid was reduced to 8 ml giving much better line definition.

During the etching the sheet 124 after exposure and developing of both surfaces 17 and 19 is treated in an etchant bath. A study was conducted to determine the optimum conditions for etching.

Varying the temperature of the etching solution resulted in varying etch factors. The optimum temperature is 84°C with lower temperatures causing greater undercutting of the resist coated image. Higher temperature caused the lines to be uneven and pitted.

In the beginning of the investigation the etching solution was agitated by a magnetic stirrer. Cross-sections of etched samples revealed that one side of each resist coated image was etching 1½ times as fast as the other. The etching was then carried out without agitation but undercutting was increased because of slower etching. The etching was more uneven because $H_2$ gas bubbles, formed during the etching, were trapped by some parts of the etched pattern causing that area to etch slower than the rest of the pattern. The etching solution is in the practice of this invention agitated by a magnetic stirrer but the sheet to be etched is rotated 180° every 30 seconds to prevent uneven etching.

After assimilating the above results the following process was used to etch aluminum.

a. Resist application
   1. The resist was filtered 60 percent Kodak Thin Film Resist (KTFR) in a Thinner, and during coating whirler rotated at 4,000 RPM.
   2. Sheet air dried for 10 minutes.
   3. Sheet baked at 120°C for 15 minutes.

b. Exposure
   1. Photoresist exposed under masks to 600 watt Quartz Iodine lamp for 2 mintues, at about 1 foot typical.

c. Development
   1. Two minutes still development in Stoddard Solvent.
   2. Ten seconds rinse in Xylene.
   3. Water rinse.
   4. Bake at 120°C for 30 minutes.

d. Etching
   1. Etching Solution a. 300 ml $H_3PO_4$
b. 200 ml $CH_3COOH$
c. 10 ml $HNO_3$ 2. Temperature of solution 95°C with magnetic stirrer agitation, part is rotated 180° every 30 seconds.
   3. Etch rate 0.0003-inch/minute.

The substrate 13 (FIG. 5) is typically composed of an insulator such as alumina. The pads 34 and 37 are produced on the surface of this substrate by printed-circuit techniques. The surface is first coated with sintered molybdenum-manganese and this coating is plated with nickel which is in turn plated with gold. The gold plating is covered with a photoresist which is imaged to produce the pads 34 and 37. The pads 34 are generally T-shaped. The pads 33 of the sheet 15 are connected to the stems 61 of the T's; the heads 63 serve to connect external terminals such as power supply, and input and output terminals.

Figure 7:
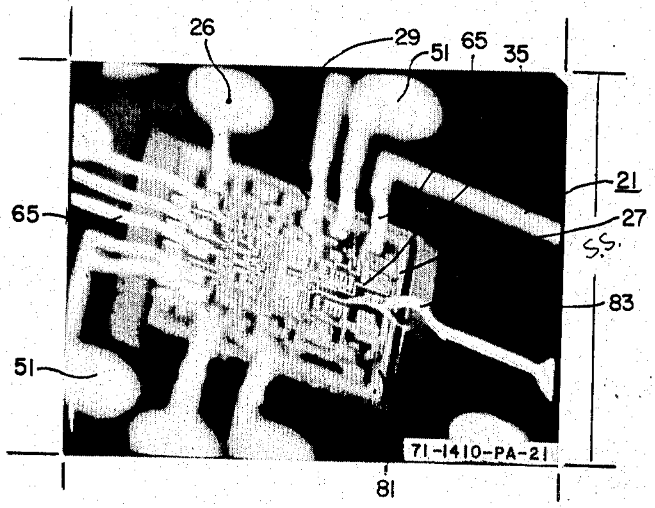
FIG. 7 is an enlarged photograph taken obliquely of a part of a completed module.

The bonding of the cantilever beams 29 to the integrated circuit terminals was carried out by ultrasonic welding. The bonding was carried out at room temperature. Because of the high ultrasonic energy demanded, vacuum hold-down of the chips 35 to the work stage was not adequate and a thermoplastic adhesive was used to secure the circuits 35 to the work holder (not shown). The effectiveness of the bonding is shown in FIG. 7. The beams 29 include loops 65 for stress relief.

To secure the pads 33 to the pads 34 and the integrated circuits to the pads 37, thermal compression bonds were produced. The substrate was heated to about 200°C and compression applied between the sheet 15 and the substrate 13 to produce the bonds. Any thermal expansion mismatch between the sheet, particularly when it is of polyimide material, and the alumina is not sufficient to break the bonds of this type.

Figure 5:
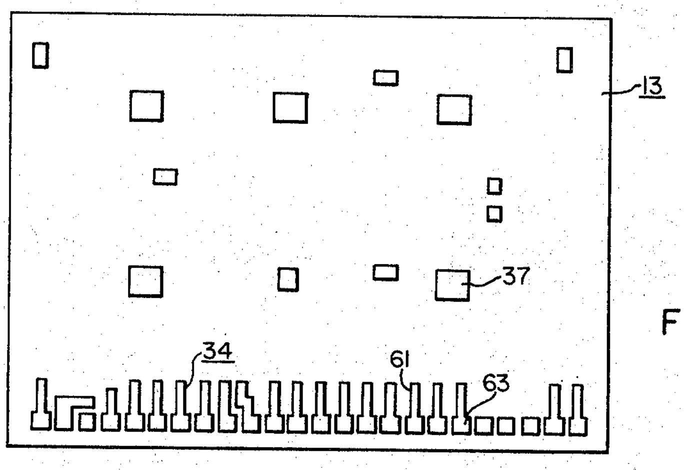
FIG. 5 is a plan view of a substrate, used in the practice of this invention, showing the printed pattern thereon.

As shown in FIG. 3, amoung the conducting strips or lines 23, there are strips or lines *23a* connected to the pads 71 and through the pads 71 to the pads 34 (FIG. 5). Through the heads 63 of pads 34 these lines *23a* are connected to external facilities. Other strips or lines *23b* are connected through the conducting walls 25 (FIG. 1) of holes 26 to conductors on the upper surface 21 of the sheet 15. This disposition of the strips *23b* avoids short circuits by crossing lines 23. Typical is the line *23b* of FIG. 3 which extends between pads *51a* and *51b* of FIG. 4 and avoids intersection with lines *21d* (FIG. 4).

The sturdiness of the thick lines 21 and 23 produced by the thick aluminum coating 43 is shown in FIG. 7. The integrated circuit 35 has an electrically conducting border 81. To avoid contact with this border 81 the cantilever lead 29 is bent or deflected at 83.

Figure 8:
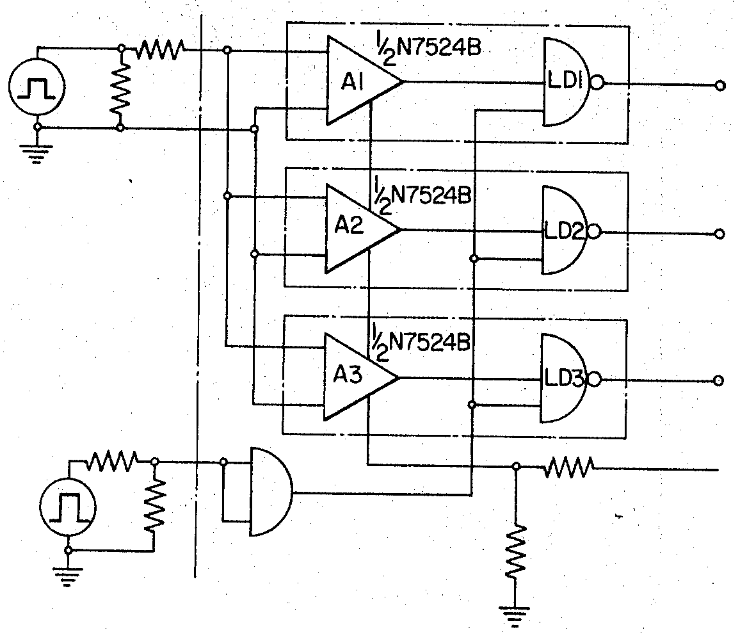
FIG. 8 is a schematic of the basic circuit of the module shown in FIGS. 3, 4 and 7.

The module shown in FIGS. 3, 4 and 7 is a sense amplifier whose basic circuit is shown in FIG. 8. The amplifiers N7524B are Signetics amplifiers and the inverter MC5400L is a Motorola amplifier. Each amplifier A1, A2 and A3 and its associated inverter LD1, LD2 and LD3 respectively constitutes one-half an integrated circuit or chip. The module includes five such integrated circuits as indicated in FIG. 4. The module includes the portion of the circuit shown in FIG. 8 to the right of the long broken line. The input terminals from the generator and the strobe the output and threshhold terminals are the leads 63 of the substrate 13.

In producing the module the Signetics N7524B and Motorola MC5400L devices were arranged into a layout which considered both minimization of interconnect lines and through holes, and uniform thermal dissipation to avoid hot spots. The final layout is an efficient, interconnection circuit. Although 14 pads on all but one sense amplifier chip are connected, the resulting interconnect pattern is not overly dense. This has the additional benefit of decreasing the possiblity of cross-talk interference. The integrated circuits have also been oriented so that the sensitive input and output lines were isolated from other terminals. Prior experience in layouts of this type has indicated that js interconnection complexity goes down, electrical performance 9s zmproved.

While a preferred embodiment 6f this znvention and ] preferred mode of practicing this invention has been disclosed herein, many modifications thereof are feasible. This invention then is not to be restricted except insofar as is necessitated by the spirit of the prior art.

What we claim is:

1. The method of making a solid-state circuit module including at least one integrated circuit unit with parts including a dielectric sheet, the said method comprising forming on said sheet in a single coating operation a metal layer, forming in said sheet at least one opening, said layer extending over one surface of said sheet and an integral portion of said layer also extending over said opening, coating said metal layer on said one surface with a photoresist, imaging said photoresist to produce a pattern of conductor strips masked by said imaged photoresist and to expose the remainder of said layer on said surface; said pattern including masked strips formed on said integral portion integrally with the remainder of said pattern and extending partially over the boundaries of said opening, etching said remainder of said layer while masking the part of the surface of said layer in said opening, which surface is opposite to the surface coated with said photoresist, removing said masking photoresist to expose the said conductor strips of said pattern, the exposed conductor strips resulting from said masked strips extending cantilever-like partially over the boundaries of said opening and forming an integral part of the exposed conductors on said sheet, positioning said unit in said opening, and connecting said cantilever-like strips to said unit.

2. The method of claim 1 wherein the sheet has at least an additional opening besides the one opening and the metal layer is deposited by vapor deposition and extends over both surfaces of the sheet and over the wall of said additional opening conductively interconnecting, the metal layer on one surface of said sheet to the metal layer on the opposite surface of said sheet and the photoresist is deposited on the metal layer on both said surfaces and is imaged to produce patterns of cooperative conductor strips on both surfaces masked by imaged photoresist, the metal layer over the wall of the additional opening being also masked, and the remainder of the metal layer on both surfaces being exposed, and wherein the exposed metal layer is etched and thereafter said masking photoresist is removed exposing the conductor strips on both surfaces, and the metal layer over said wall with conductor strips on one of said surfaces extending cantiliver-like over the opening, and wherein thereafter the integrated circuit unit is positioned and connected as described in claim 1.

3. The method of claim 1 wherein the sheet has a plurality of openings therein, the metal layer extending over certain of said openings integrally with the metal layer over the remainder of said sheet, the portions of the metal layer extending over said last-named certain openings remaining over said last-named opening after the imaging and subsequent processing to produce conductor strips, and wherein the said portions serve to secure the sheet to a substrate.

4. The method of claim 1 wherein the cantilever-like conductor strips are connected to the integrated circuit unit by ultrasonic welding.

5. The method of claim 1 wherein the metal layer in aluminum and, to achieve precise definition of the conductor strips, the etchant is a solution of phosphoric acid, acetic acid and nitric acid, the said acids being included in said solutions in proportions such that the quantity of phosphoric acid is sufficient to maximize the etch factor without deteriorating strip definition, the quantity of acetic acid is sufficient to improve the etch factor and to prevent undercutting of the photoresist masking the strips and the quantity of the nitric acid is just sufficient to suppress the formation of a black residue.

6. The method of claim 5 wherein the solution is predominately phosphoric acid but includes effective quantities of acetic and nitric acid.

7. The method of claim 5 wherein the solution comprises substantially:

300 parts by volume of phosphoric acid
200 parts by volume of acetic acid
10 parts by volume of nitric acid and the etching is carried out at 95°C.

8. The method of claim 1 including the step of deflecting at least one of the conductor strips to avoid its contacting another electrical conductor, the metal layer from which said conductor strips are formed being of adequate thickness to permit such deflection.

9. The method of claim 1 wherein the sheet, having at least one opening therein over which a metal layer extends, is formed by depositing by vapor deposition on both surfaces of a sheet, coating one surface of said sheet with a photoresist, imaging said photoresist to produce a pattern such that the metal layer over the area where said opening is to be produced is exposed, etching said exposed metal layer to expose the portion of the sheet under said exposed conductor, and thereafter etching said portion of said sheet to produce said opening.

* * * * *